United States Patent
Kuo et al.

(10) Patent No.: US 12,205,923 B2
(45) Date of Patent: Jan. 21, 2025

(54) SEMICONDUCTOR DEVICE, CIRCUIT BOARD STRUCTURE AND MANUFACTURING METHOD THEREOF

(71) Applicant: Taiwan Semiconductor Manufacturing Company, Ltd., Hsinchu (TW)

(72) Inventors: Tin-Hao Kuo, Hsinchu (TW); Chen-Hua Yu, Hsinchu (TW); Chung-Shi Liu, Hsinchu (TW); Hao-Yi Tsai, Hsinchu (TW); Yu-Chia Lai, Miaoli County (TW); Po-Yuan Teng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/086,545

(22) Filed: Dec. 21, 2022

(65) Prior Publication Data

US 2023/0120191 A1   Apr. 20, 2023

Related U.S. Application Data

(60) Continuation of application No. 17/396,773, filed on Aug. 9, 2021, now Pat. No. 11,569,202, which is a
(Continued)

(51) Int. Cl.
*H01L 25/00* (2006.01)
*H01L 23/00* (2006.01)
*H01L 23/31* (2006.01)
*H01L 23/522* (2006.01)
*H01L 23/528* (2006.01)
*H01L 23/532* (2006.01)
*H01L 23/538* (2006.01)
(Continued)

(52) U.S. Cl.
CPC ...... *H01L 25/0655* (2013.01); *H01L 23/3185* (2013.01); *H01L 23/5226* (2013.01); *H01L 23/5283* (2013.01); *H01L 23/53228* (2013.01); *H01L 23/5383* (2013.01); *H01L 23/5386* (2013.01); *H01L 24/09* (2013.01); *H01L 24/17* (2013.01); *H01L 25/50* (2013.01); *H05K 1/0271* (2013.01); *H05K 1/0298* (2013.01); *H01L 2224/02373* (2013.01)

(58) Field of Classification Search
CPC .............. H01L 25/0655; H01L 23/562; H05K 2201/09972
See application file for complete search history.

(56) References Cited

U.S. PATENT DOCUMENTS 5,786,988 A * 7/1998 Harari ................. H01L 23/5388
235/487
8,592,997 B2 * 11/2013 Yu .......................... H01L 21/563
257/E23.116
(Continued)

*Primary Examiner* — Nicholas J Tobergte
(74) *Attorney, Agent, or Firm* — JCIPRNET

(57) ABSTRACT

A semiconductor device, a circuit board structure and a manufacturing forming thereof are provided. A circuit board structure includes a core layer, a first build-up layer and a second build-up layer. The first build-up layer and the second build-up layer are disposed on opposite sides of the core layer. The circuit board structure has a plurality of stress releasing trenches extending into the first build-up layer and the second build-up layer.

20 Claims, 12 Drawing Sheets

Related U.S. Application Data division of application No. 16/258,677, filed on Jan. 28, 2019, now Pat. No. 11,088,110.

(51) Int. Cl.
*H01L 25/065* (2023.01)
*H05K 1/02* (2006.01)

(56) References Cited

U.S. PATENT DOCUMENTS

| | | | |
|---|---|---|---|
| 8,993,380 B2 | 3/2015 | Hou et al. | |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,560,746 B1* | 1/2017 | Bergman | H05K 1/189 |
| 9,666,502 B2 | 5/2017 | Chen et al. | |
| 9,735,131 B2 | 8/2017 | Su et al. | |
| 10,461,007 B2* | 10/2019 | Dias | H01L 23/3128 |
| 10,522,452 B2* | 12/2019 | Huang | H01L 23/49822 |
| 2003/0182797 A1* | 10/2003 | Tsai | H05K 3/28 |
| | | | 29/829 |
| 2006/0125075 A1* | 6/2006 | Liao | H01L 21/565 |
| | | | 257/762 |
| 2007/0204250 A1* | 8/2007 | Moroz | H01L 29/7848 |
| | | | 716/55 |
| 2007/0257345 A1* | 11/2007 | Fan | H01L 24/97 |
| | | | 257/678 |
| 2010/0044880 A1* | 2/2010 | Aokura | H01L 23/49822 |
| | | | 257/777 |
| 2013/0181342 A1* | 7/2013 | Park | H01L 23/49816 |
| | | | 257/E23.06 |

* cited by examiner

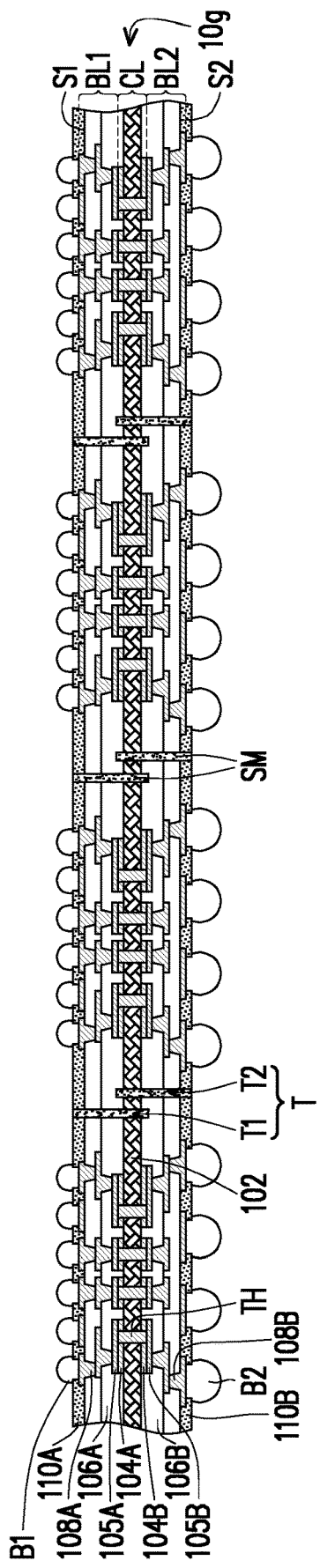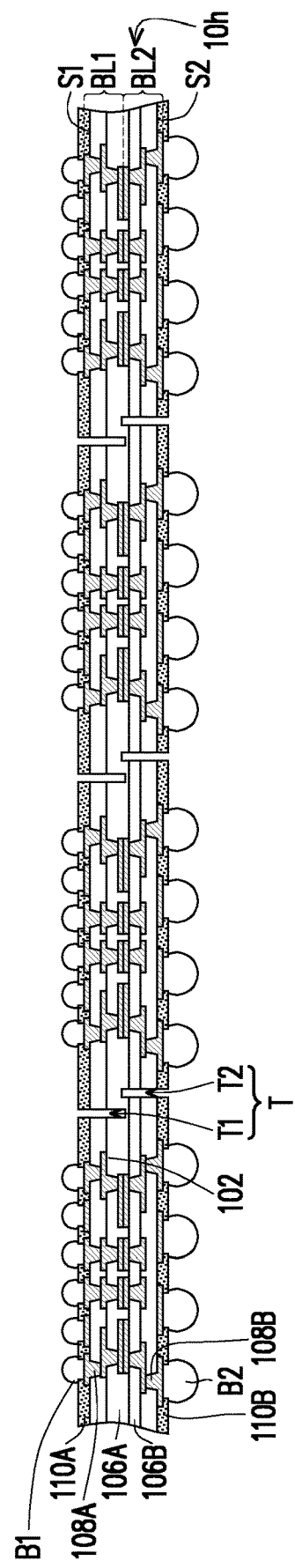
FIG. 8
FIG. 9

SEMICONDUCTOR DEVICE, CIRCUIT BOARD STRUCTURE AND MANUFACTURING METHOD THEREOF

CROSS-REFERENCE TO RELATED APPLICATION

This application is a continuation application of and claims the priority benefit of a prior application Ser. No. 17/396,773, filed on Aug. 9, 2021. The prior application Ser. No. 17/396,773 is a divisional application of and claims the priority benefit of a prior application Ser. No. 16/258,677, filed on Jan. 28, 2019. The entirety of each of the above-mentioned patent applications is hereby incorporated by reference herein and made a part of this specification.

BACKGROUND

Semiconductor devices are used in a variety of electronic applications, such as data center, server, high performance computing, AI computing, cloud computing, personal computers, cell phones, digital cameras, and other electronic equipment. In terms of the packaging used for integrated circuit components or semiconductor chips, one or more chip packages are generally bonded to a printed circuit board for electrical connections to other external devices or electronic components. Although the existing printed circuit board has been generally adequate for their intended purposes, it has not been entirely satisfactory in all respects.

BRIEF DESCRIPTION OF THE DRAWINGS

FIG. 2 to FIG. 9 are cross-sectional views of various circuit board structures in accordance with some embodiments.

DETAILED DESCRIPTION

Figure 1A:
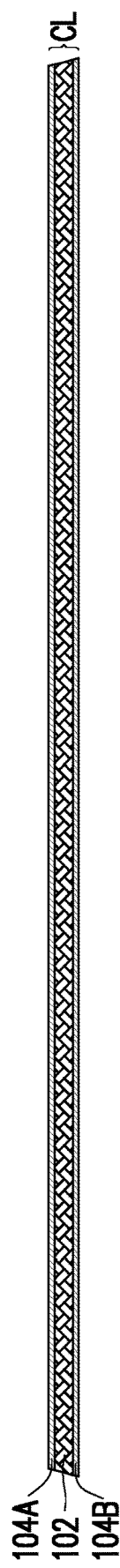
FIG. 1A to FIG. 1G are cross-sectional views of a method of manufacturing a semiconductor device in accordance with some embodiments.

The following disclosure provides many different embodiments, or examples, for implementing different features of the provided subject matter. Specific examples of components and arrangements are described below for the purposes of conveying the present disclosure in a simplified manner. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the same reference numerals and/or letters may be used to refer to the same or similar parts in the various examples the present disclosure. The repeated use of the reference numerals is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein to facilitate the description of one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A to FIG. 1G are cross-sectional views of a method of manufacturing a semiconductor device in accordance with some embodiments.

Referring to FIG. 1A, a core layer CL is provided. In some embodiments, the core layer CL includes a core dielectric layer 102, a first core conductive layer 104A and a second core conductive layer 104B. In some embodiments, the core dielectric layer 102 includes prepreg (which contains epoxy, resin, and/or glass fiber), polyimide, photo image dielectric (PID), a combination thereof, or the like. However, the disclosure is not limited thereto, and other dielectric materials may also be used. The first core conductive layer 104A and the second core conductive layer 104B are formed on the opposite sides of the core dielectric layer 102. In some embodiments, the first core conductive layer 104A and the second core conductive layer 104B include copper, gold, tungsten, aluminum, silver, gold, a combination thereof, or the like. In some embodiments, the first core conductive layer 104A and the second core conductive layer 104B are copper foils coated or plated on the opposite sides of the core dielectric layer 102.

Figure 1B:
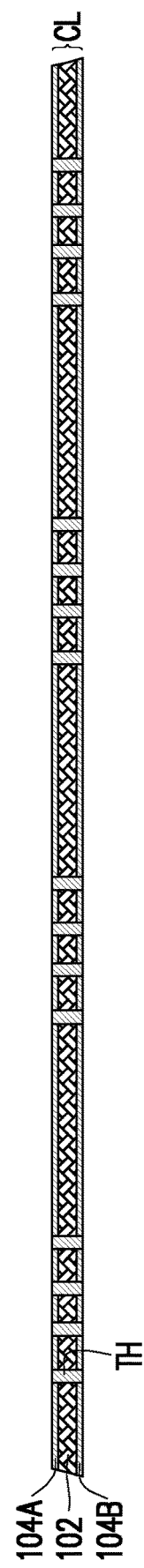

Referring to FIG. 1B, a plurality of plated through holes TH is formed to penetrate through the core layer CL. In some embodiments, the plated through holes TH provide electrical paths between the electrical circuits located on the opposite sides of the core layer CL. In some embodiments, the plated through holes TH may be filled with one or more conductive materials. In some embodiments, the plated through holes TH may be lined with a conductive material and filled up with an insulating material. In some embodiments, the method of forming the plated through holes TH includes the following operations. First, through holes (not shown) are formed at the predetermined positions by, for example, a mechanical or laser drilling, an etching, or another suitable removal technique. A desmear treatment may be performed to remove residues remaining in the through holes. Subsequently, the through holes may be plated with one or more conductive materials to a predetermined thickness, thereby providing the plated through holes TH. For example, the through holes may be plated with copper with an electroplating or an electroless plating.

Figure 1C:
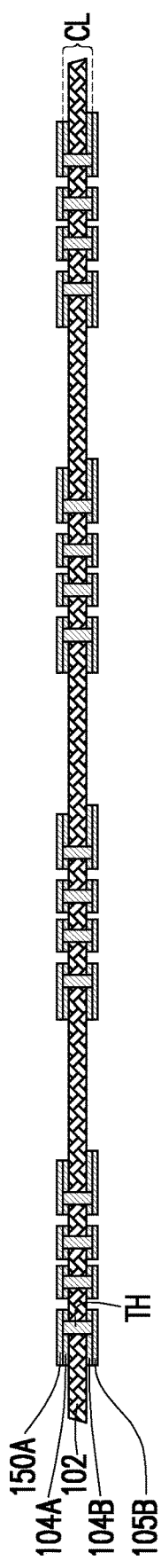

Referring to FIG. 1C, conductive materials (not shown) are formed over the first and second core conductive layers 104A and 104B, and formed over the plated through holes TH. For example, copper is plated on the surfaces of the first and second core conductive layers 104A and 104B and the surfaces of the plated through holes T with an electroplating or an electroless plating. Thereafter, the conductive materials and the first and second core conductive layers 104A and 104B may be patterned together to form first and second conductive lids 105A and 105B that are located respectively over the remaining first and second core conductive layers 104A and 104B. In some embodiments, portions of the conductive materials and portions of the first and second core conductive layers 104A and 104B may be removed using a photolithography and etching process or another suitable removal technique.

Figure 1D:
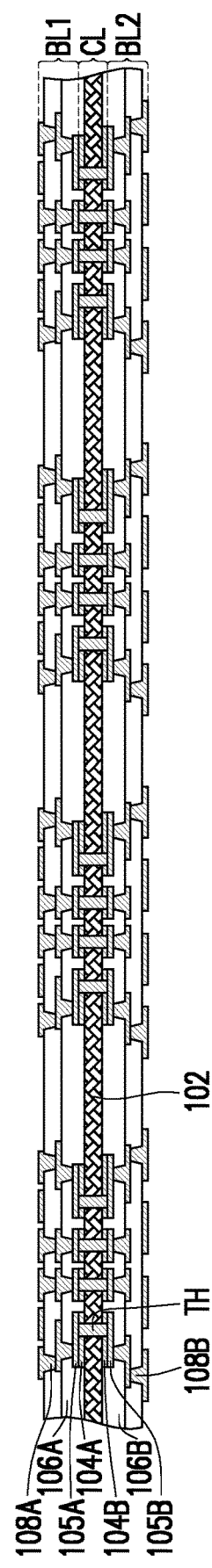

Referring to FIG. 1D, a first build-up layer BL1 and a second build-up layer BL2 are formed on the opposite sides of the core layer CL. Specifically, the first build-up layer BL1 is formed over the first core conductive layer 104A of the core layer CL, and the second build-up layer BL2 is formed over the second core conductive layer 104B of the first core layer CL. In some embodiment, the formation of the first build-up layer BL1 may include sequentially forming a plurality of first dielectric layers 106A and a plurality of first conductive patterns 108A alternately stacked over the first surface of the core layer CL. Similarly, the formation of the second build-up layer BL2 may include sequentially forming a plurality of second dielectric layers 106B and a plurality of second conductive patterns 108B alternately stacked over the second surface of the core layer CL. Although only two layers of conductive patterns and two layers of dielectric layers are illustrated for each of the first build-up layer BL1 and the second build-up layer BL2, the scope of the disclosure is not limited thereto. In other embodiments, the number of dielectric layers (106A/106B) and the number of the conductive patterns (108A/108B) may be adjusted upon the design requirements. In some embodiments, the total number of layers of the first build-up layer BL1 and the second build-up layer BL2 may sum up to a total of 28 to 36 layers for the conductive patterns and dielectric layers. In some embodiments, the number of layers in the first build-up layer BL1 is equal to the number of layers in the second build-up layer BL2.

In some embodiments, the first build-up layer BL1 and the second build-up layer BL2 are electrically connected to the plated through holes TH. For example, the first and second conductive patterns 108A and 108B may be electrically connected to the plated through holes TH through the first and second conductive lids 105A and 105B and the first and second core conductive layers 104A and 104B.

In some embodiments, the first and second dielectric layers 106A and 106B include prepreg (which contains epoxy, resin, and/or glass fiber), polyimide, polybenzoxazole (PBO), benzocyclobutene (BCB), a nitride such as silicon nitride, an oxide such as silicon oxide, phosphosilicate glass (PSG), borosilicate glass (BSG), boron-doped phosphosilicate glass (BPSG), a combination thereof, or the like. In some embodiments, the first and second dielectric layers 106A and 106B may be patterned using a photolithography and/or etching process. In some embodiments, the first and second dielectric layers 106A and 106B may be patterned by a film lamination followed by a laser drilling process.

In some embodiments, the first and second conductive patterns 108A and 108B include metal, such as aluminum, titanium, copper, nickel, tungsten, and/or alloys thereof. In some embodiments, the first and second conductive patterns 108A and 108B may be formed by a deposition followed by a photolithography and etching process. In some embodiments, the first and second conductive patterns 108A and 108B may be formed by an electroplating or an electroless plating.

Figure 1E:
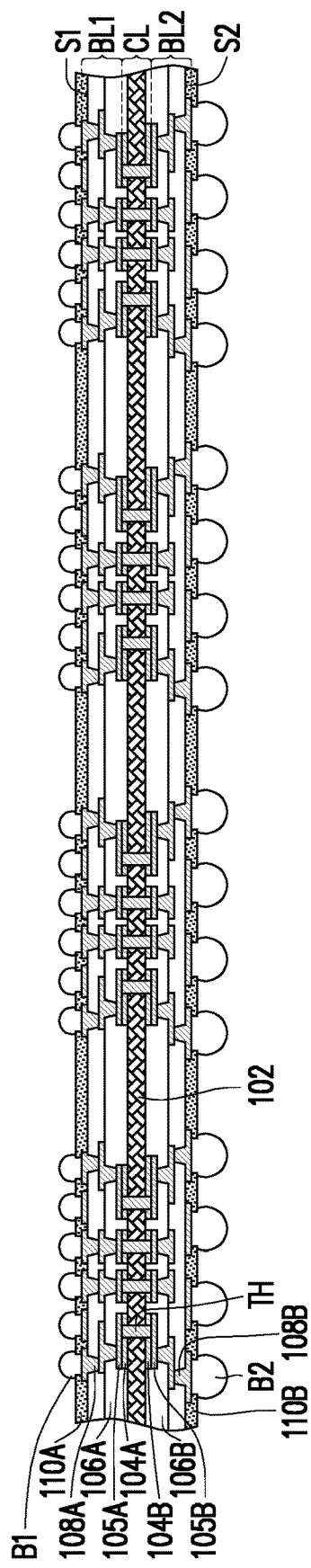

Referring to FIG. 1E, a first mask layer 110A is formed over the outermost first dielectric layer 106A of the first build-up layer BL1, and a second mask layer 110B is formed over the outermost second dielectric layer 106B of the second build-up layer BL2. In some embodiments, the first mask layer 110A includes a plurality of first openings that partially exposes the outermost first conductive pattern 108A, and the second mask layer 110B includes a plurality of second openings that partially exposes the outermost second conductive pattern 108B. In some embodiments, the first and second mask layers 110A and 110B may be formed of materials having a chemical composition of silica, barium sulfate and epoxy resin, and/or the like. For example, the first and second mask layers 110A and 110B may serve as solder masks and may be selected to prevent short, corrosion or contamination of the circuit pattern and protect the circuit of the printed circuit board from external impacts and chemicals.

Thereafter, a plurality of first conductive terminals B1 is formed in the first openings of the first mask layer 110A over the first build-up layer BL1, and a plurality of second conductive terminals B2 is formed in the second openings of the second mask layer 110B over the second build-up layer BL2. In some embodiments, the first and second conductive terminals B1 and B2 may be solder bumps, and/or may include metal pillars (e.g., copper pillars), solder caps formed on metal pillars, and/or the like. When solder is used, the solder may include either eutectic solder or non-eutectic solder. The solder may include lead or be lead-free, and may include Sn—Ag, Sn—Cu, Sn—Ag—Cu, or the like. The first and second conductive terminals B1 and B2 may be formed respectively by a suitable process such as an evaporation, an electroplating, a ball drop, or a screen printing. In some embodiments, the size of the first conductive terminals B1 is different from (e.g., less than) the size of the second conductive terminals B2. In some embodiments, the number of the first conductive terminals B1 is different from (e.g., greater than) the number of the second conductive terminals B2. However, the disclosure is not limited thereto. The size and/or the number of the first conductive terminals B1 may be similar to the size and/or the number of the second conductive terminals B2.

Figure 1F:
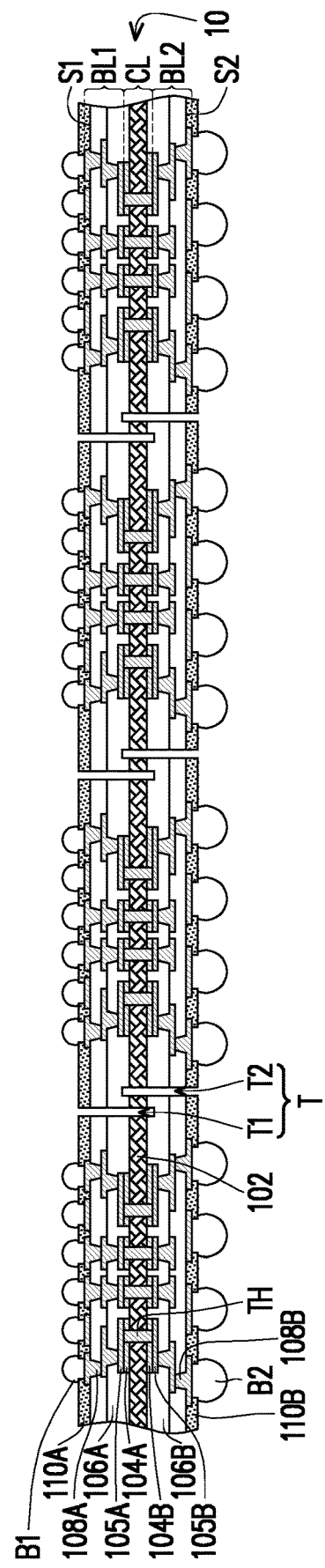

Referring to FIG. 1F, a plurality of stress releasing trenches T is formed to extend into the first build-up layer BL1 and the second build-up layer BL2. In some embodiments, the stress releasing trenches T may be formed by a laser drilling process at the predetermined positions, but the disclosure is not limited thereto. In other embodiments, a mechanical drilling process, an etching, or another suitable removal technique may be used. In some embodiments, the stress releasing trenches T are configured to reduce the stress come from the coefficient of thermal expansion (CTE) mismatch between different materials, and therefore prevent the joint crack and improve the warpage profile of the resulting device.

In some embodiments, the stress releasing trenches T include a plurality of first trenches T1 and a plurality of second trenches T2 respectively extending into the first build-up layer BL1 and the second build-up layer BL2. Specifically, the first trenches T1 extend from the first side S1 of the first build-up layer BL1, penetrate through the first build-up layer BL1 and the core layer CL, and further extend into (but not through) the second build-up layer BL2. Similarly, the second trenches T2 extend from the second side S2 of the second build-up layer BL2, penetrate through the second build-up layer BL2 and the core layer CL, and further extend into (but not through) the first build-up layer BL1. The first side S1 of the first build-up layer BL1 is opposite to the second side S2 of the second build-up layer BL2.

At this point, a circuit board structure 10 according to some embodiments of the disclosure is thus completed. In some embodiments, the circuit board structure 10 includes a core layer CL, a first build-up layer BL1, a second build-up layer BL2 and multiple stress releasing trenches T. The circuit board structure may be called a circuit carrier, a system board or a circuit substrate in some examples. The circuit board structure of the disclosure and its modifications will be described in details below.

Figure 1G:
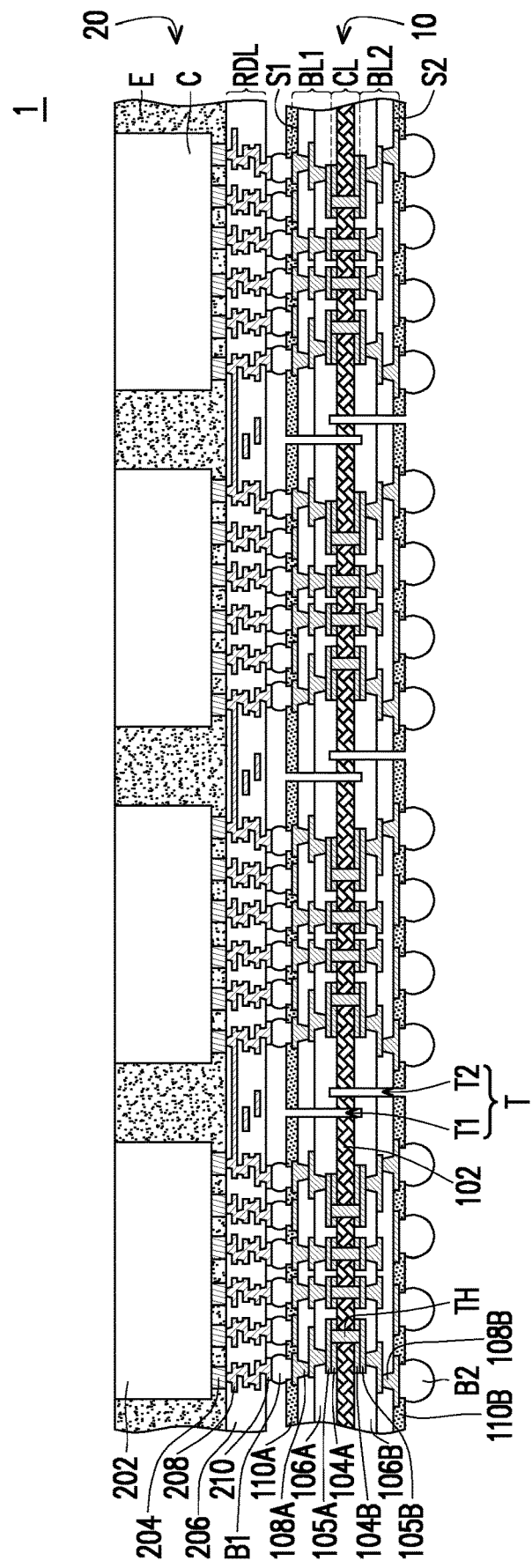

Referring to FIG. 1G, a package structure 20 is bonded to the circuit board structure 10. In some embodiments, the package structure 20 may be stacked on the circuit board structure 10 and electrically connected to the circuit board structure 10 through a redistribution layer structure RDL and first conductive terminals B1.

In some embodiments, the package structure 20 includes a plurality of semiconductor chips C arranged side by side. In some embodiments, the package structure 20 is a single and super large package including multiple semiconductor chips C. In alternative embodiments, the package structure 20 includes a plurality of individual packages, and each package includes at least one semiconductor chip C.

In some embodiments, the package structure 20 may include application processors (AP), System-On-Chips (SoC), Chip-On-Wafer (CoW) packages, Integrated-Fan-Out (InFO) packages, Chip-On-Wafer-On-Substrate (CoWoS) packages, other three-dimensional integrated circuit (3DIC) packages, or a combination thereof. In some embodiments, the semiconductor chips C may include integrated active devices, integrated passive device or both. For example, the package structure 20 may include a wide variety of devices, such as processors, resistors, capacitors, transistors, diodes, fuse devices, logic devices, memory devices, discrete electronic devices, power devices, thermal dissipation devices, and/or the like. In some embodiments, some of the semiconductor chips C may be dummy chips. Herein, a dummy die indicates a non-operating die, a die configured for non-use, a die without devices therein or a die used only to electrically couple together two other dies in the die stack. The adjacent semiconductor chips C may have the same or different sizes and/or functions upon the design requirements.

In some embodiments, each semiconductor chip C includes a substrate 202 and a plurality of connectors 204. The substrate 202 includes, for example but not limited to, bulk silicon, doped or undoped, or an active layer of a semiconductor-on-insulator (SOI) substrate. The substrate 202 may have at least one device thereon. The connectors 204 are formed over the substrate 202 and electrically connected to the device through an interconnection structure between the device and the connectors 204. In some embodiments, the connectors 204 are formed as the top portion of the semiconductor chip C. The connectors 204 protrude from the remaining portion or lower portion of the semiconductor chip C. In some embodiments, the side of the semiconductor chip C with the connectors 204 is referred to as a front side. The connectors 204 may include Cu, W, Ni, Sn, Ti, Au, an alloy or a combination thereof, and are formed with a ball drop process or an electroplating process. In some embodiments, the connectors 204 are referred to as front-side connectors of the semiconductor chip C.

In some embodiments, the package structure 20 further includes an encapsulation layer E between the semiconductor chips C. In some embodiments, the encapsulation layer E is formed to encapsulate or surround the sidewalls of the semiconductor chips C. In some embodiments, the encapsulation layer E includes a molding compound, a molding underfill, a resin or the like, such as epoxy. In some embodiments, the encapsulation layer E includes a polymer material such as polybenzoxazole (PBO), polyimide, benzocyclobutene (BCB), a combination thereof, or the like, and is formed by a molding process followed by a grinding process until surfaces of the connectors 204 of the semiconductor chips C are exposed. In some embodiments, through integrated fan-out vias (TIV) (not shown) may be formed through the encapsulation layer E upon the design requirements.

In some embodiments, the package structure 20 further includes a redistribution layer structure RDL electrically connected to the semiconductor chips C. The redistribution layer structure RDL is referred to as a "front-side redistribution layer structure" in some examples. In some embodiments, the redistribution layer structure RDL includes a plurality of redistribution layers 208 embedded by a plurality of polymer layers 206. In some embodiments, each of the redistribution layers 208 includes copper, nickel, titanium, a combination thereof, or the like, and is formed by photolithography, plating, and photoresist stripping processes. In some embodiments, each of the polymer layers 206 includes a polymer material such as polybenzoxazole (PBO), polyimide (PI), benzocyclobutene (BCB), a combination thereof or the like, and is formed by a suitable fabrication technique such as spin-coating, lamination, deposition or the like. In some embodiments, the redistribution layer structure RDL further includes a plurality of connecting pads 210 configured to connect to other external circuitry, such as a printed circuit board. Specifically, the connecting pads 210 of the redistribution layer structure RDL are bonded to the first conductive terminals B1, so as to bond the package structure 20 to the circuit board structure 10.

At this point, a semiconductor device 1 having the package structure 20 stacked on the circuit board structure 10 is fabricated. In some embodiments, the semiconductor device 1 includes a circuit board structure 10, a plurality of semiconductor chips C bonded to the circuit board structure 10, and an encapsulation layer E disposed between the semiconductor chips C. In some embodiments, the stress releasing trenches T of the circuit board structure 10 correspond to the encapsulation layer E between the semiconductor chips C. Specifically, from a top view, the stress releasing trenches T of the circuit board structure 10 is not overlapped with the semiconductor chips C. However, the present disclosure is not limited thereto. In alternative embodiments, from a top view, some of the stress releasing trenches T of the circuit board structure 10 may be partially overlapped with the semiconductor chips C if needed. The stress releasing trenches T of the disclosure are configured to reduce the CTS stress, prevent the joint crack and improve the warpage profile of the resulting device.

The circuit board structure of the disclosure and its modifications will be described below with reference to the cross-sectional views of FIG. 1F and FIGS. 2-9.

In some embodiments, a circuit board structure 10/10a-g includes a core layer CL, a first build-up layer BL1 and a second build-up layer BL2. The first build-up layer BL1 and the second build-up layer BL2 are disposed on opposite sides of the core layer CL. The first build-up layer BL1 includes a plurality of first conductive patterns 108A embedded by a plurality of first dielectric layers 106A, and the second build-up layer BL2 includes a plurality of second conductive patterns 108B embedded by a plurality of second dielectric layers 106B. In some embodiments, the first build-up layer BL1 is electrically connected to the second build-up layer BL2 through multiple plated through holes TH in the core layer CL and first and second conductive lids 105A and 105B on the opposite sides of the core layer CL.

In some embodiments, the circuit board structure 10/10a-g further includes a first mask layer 110A, a second mask layer 110B, first conductive terminals B1 and second conductive terminals B2. The first mask layer 110A is disposed on the outermost first dielectric layer 106A of the first build-up layer BL1, and the second mask layer 110B is disposed on the outermost second dielectric layer 106B of the second build-up layer BL2. The first conductive terminals B1 penetrate through first mask layer 110A and are electrically to the outermost first conductive pattern 108A of the first build-up layer BL1, and the second conductive terminals B2 penetrate through second mask layer 110B and are electrically to the outermost second conductive pattern 108B of the second build-up layer BL2.

In some embodiments, the circuit board structure 10/10a-g has a plurality of stress releasing trenches T extending into the first build-up layer BL1 and the second build-up layer BL2. In some embodiments, the stress releasing trenches T penetrate through the first mask layer 110A and/or the second mask layer 110B. In some embodiments, the stress releasing trenches penetrate through the dielectric materials (e.g., first/second dielectric layers 106A/106B and/or core dielectric layer 102) without exposing conductive materials.

In some embodiments, as shown in FIG. 1F and FIGS. 2-4, the stress releasing trenches T includes a plurality of first trenches T1 extending from a first side S1 of the first build-up layer BL and a plurality of second trenches T2 extending from a second side S2 of the second build-up layer, and the first side S1 is opposite to the second side S2.

Figure 4:
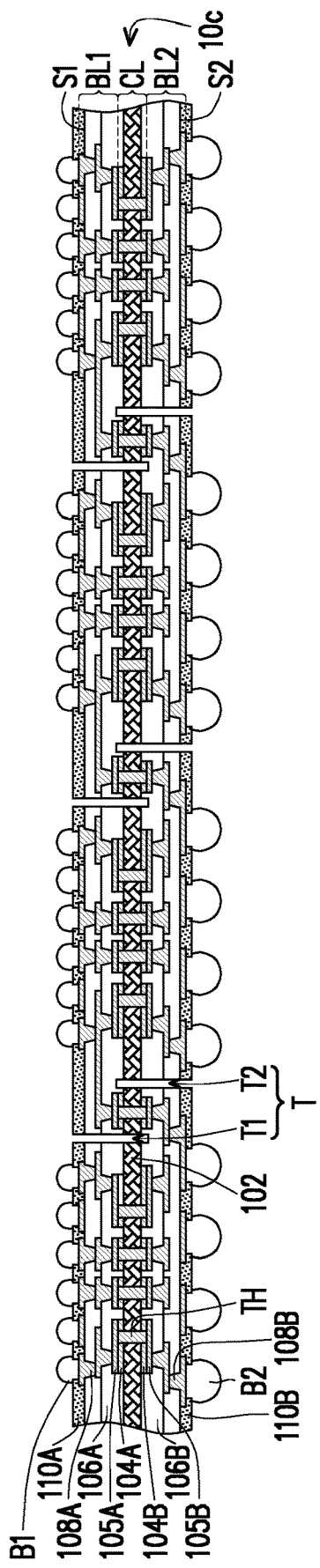

In some embodiments, as shown in FIG. 1F and FIG. 4, the first trenches T1 extend through the first build-up layer BL1 and the core layer CL, and further extend into (but not through) the second build-up layer BL2. Similarly, the second trenches T2 extend through the second build-up layer BL2 and the core layer CL, and further extend into (but not through) the first build-up layer BL1.

In some embodiments, one plated through hole may be disposed between two adjacent first and second trenches T1 and T2, and parts of first and second conductive patterns 108A and 108B are configured to bypass the ends of the first and second trenches T1 and T2, as shown in FIG. 4. In some embodiments, no plated through hole is present between two adjacent first and second trenches T1 and T2, as shown in FIG. 1F.

Figure 2:
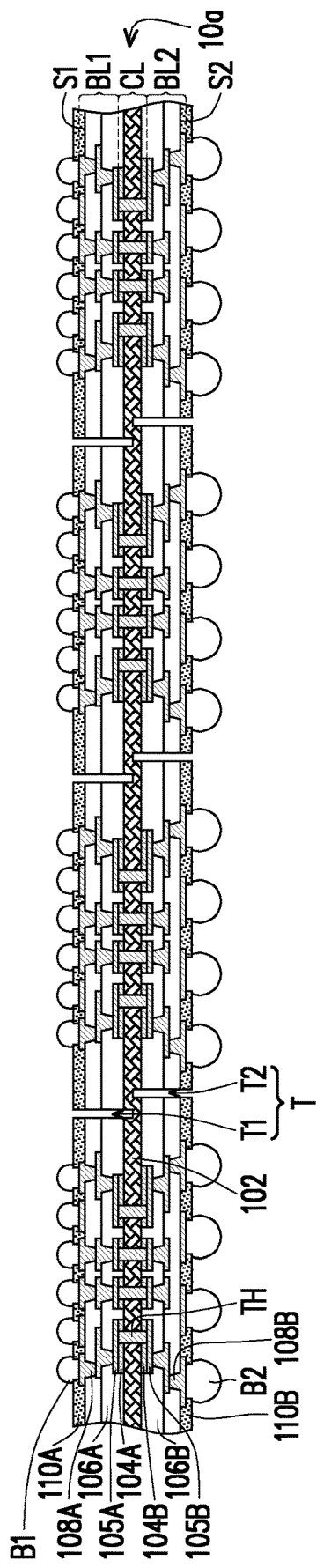
Figure 3:
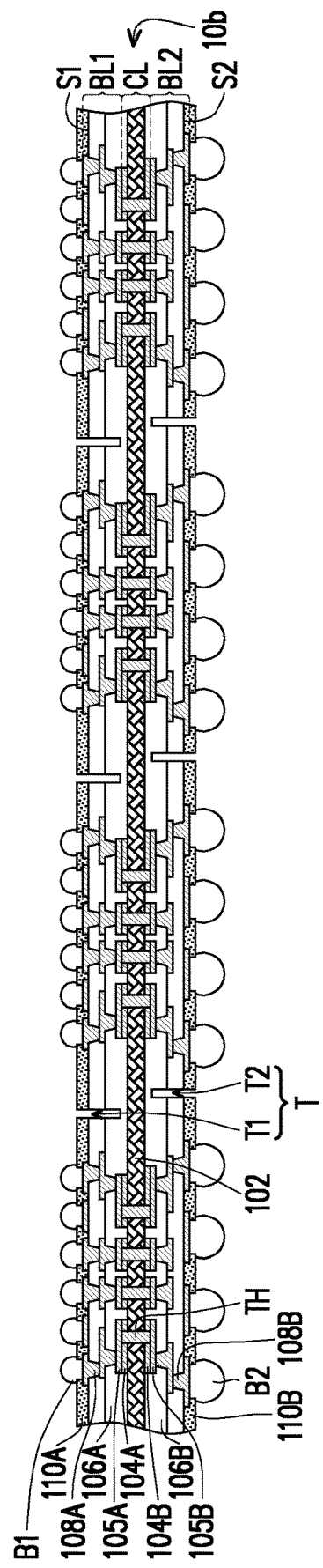

In some embodiments, as shown in FIG. 2, the first trenches T1 extend through the first build-up layer BL1, further extend into (but not through) the core layer CL. Similarly, the second trenches T2 extend through the second build-up layer BL2, further extend into (but not through) the core layer CL. In some embodiments, as shown in FIG. 3, the first trenches T1 extend into (but not through) the first build-up layer BL1, and the second trenches T2 extend into (but not through) the second build-up layer BL2.

From another point of view, the first trenches T1 may be partially overlapped with the second trenches T2 from a side view, as shown in FIG. 1F and FIG. 4. Alternatively, the first trenches T1 are not overlapped with the second trenches T2 from a side view, as shown in FIGS. 2-3. The depths of the first and second trenches T1 and T2 may be adjusted as needed, and the depths of the and second trenches T1 and T2 may be varied, as long as the CTE stress of the semiconductor device can be released properly and optimally.

Figure 5:
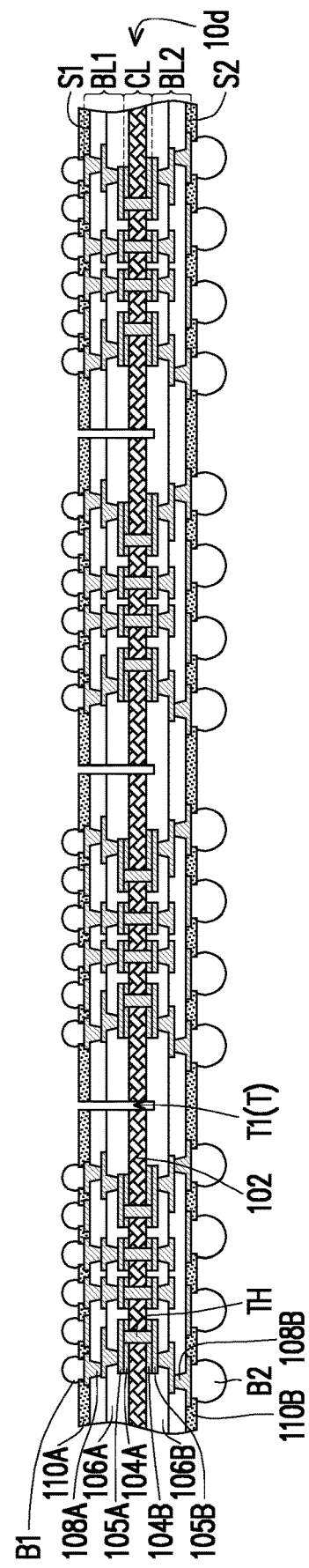
Figure 6:
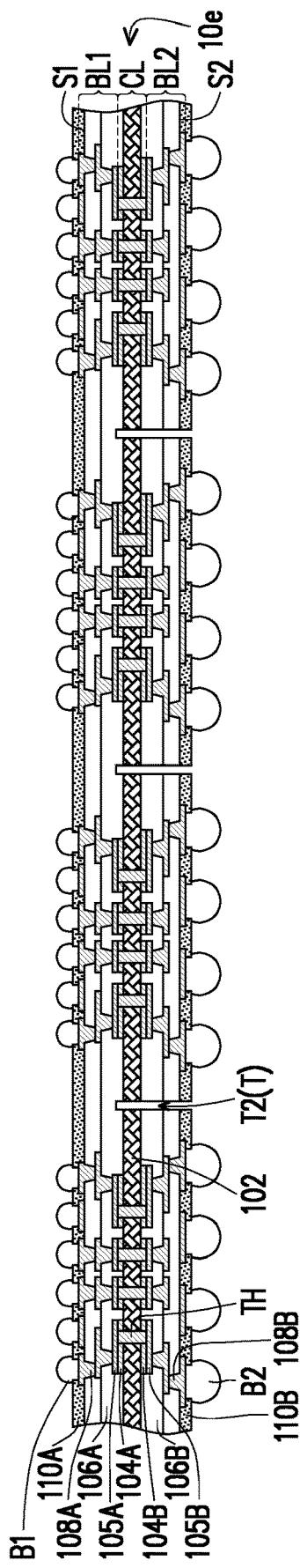

In some embodiments, the stress releasing trenches T may be configured at single side to reduce the process cost. In some embodiments, the stress releasing trenches T are constituted by the first trenches T1 extending from the first surface S1 of the first build-up layer BL1, as shown in FIG. 5. In some embodiments, the stress releasing trenches T are constituted by the first trenches T2 extending from the second surface S2 of the second build-up layer BL2, as shown in FIG. 6.

Figure 7:
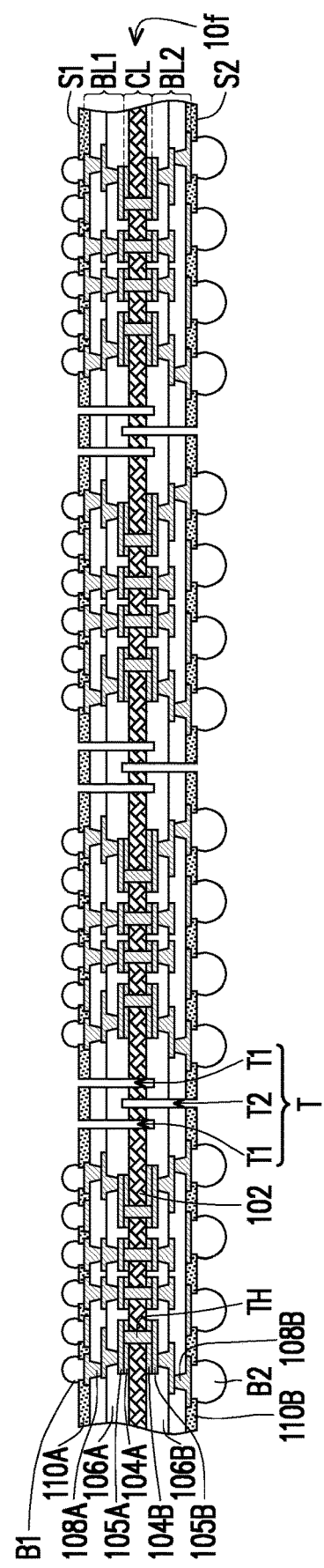

In some embodiments, the first trenches T1 and the second trenches T2 are arranged alternately, as shown in FIG. 1F and FIGS. 2-4. In some embodiments, two of the first trenches T1 are arranged to beside one of the second trenches T2, as shown in FIG. 7.

Besides, the number of trenches between two adjacent ball arrays is not limited by the illustrated figures. The number of trenches may be one (see FIGS. 5-6), two (see FIGS. 1F, 2-4), three (see FIG. 7) or more, as long as the CTE stress of the semiconductor device can be released properly and optimally.

The mentioned embodiments in which the stress releasing trenches T are open trenches and exposed to the atmosphere are provided for illustration purposes, and are not construed as limiting the present disclosure. In some embodiments, the stress releasing trenches T may be lined with moisture blocking material or filled with a soft material SM, as shown in the circuit board structure 10g of FIG. 8. The Young's modulus value of the soft material SM may be less than the Young's modulus value of the adjacent dielectric layers (106A/106B) or the Young's modulus value of the whole circuit board structure. In some embodiments, the soft material SM has a Young's modulus value of about 15 Gpa or less, such as from 10 Gpa to 15 Gpa.

In the above embodiments, the stress releasing trenches are configured for core-containing circuit board structures, but the present disclosure is not limited thereto. In some embodiments, the stress releasing trenches of the disclosure may be applied to a coreless circuit board structure 10h, as shown in FIG. 9.

The circuit board structure of the disclosure and its modifications will be described below with reference to the top views of FIGS. 10-13.

Figure 10:
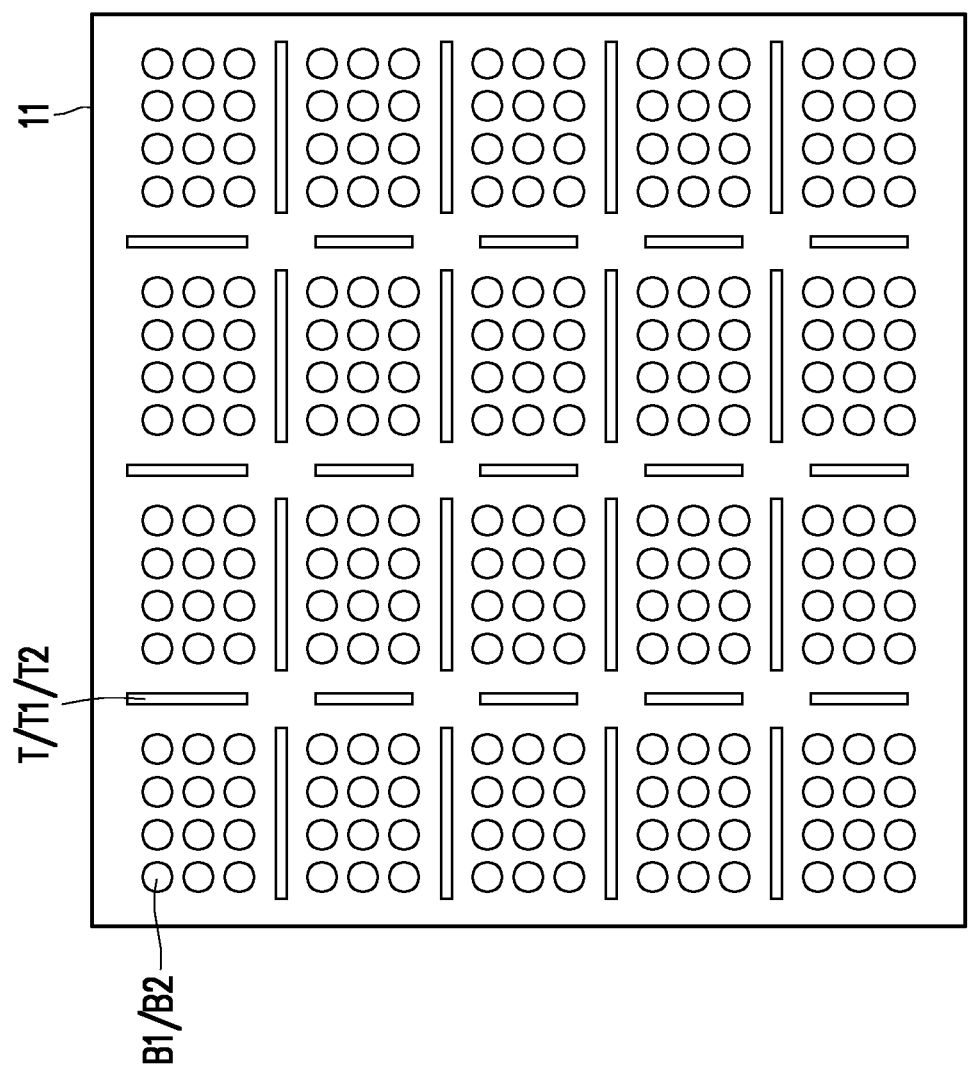
FIG. 10 to FIG. 13 are simplified top views of various circuit board structures in accordance with some embodiments.
Figure 11:
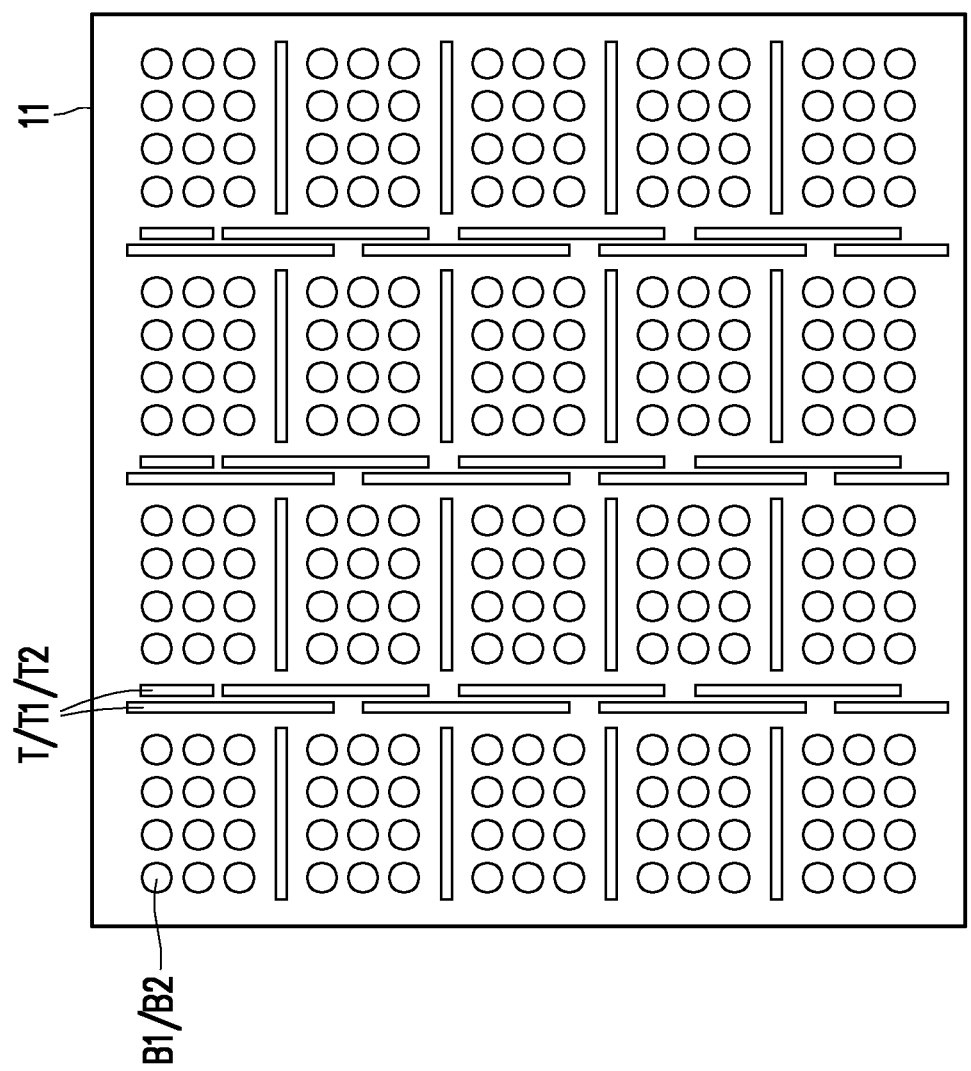
Figure 12:
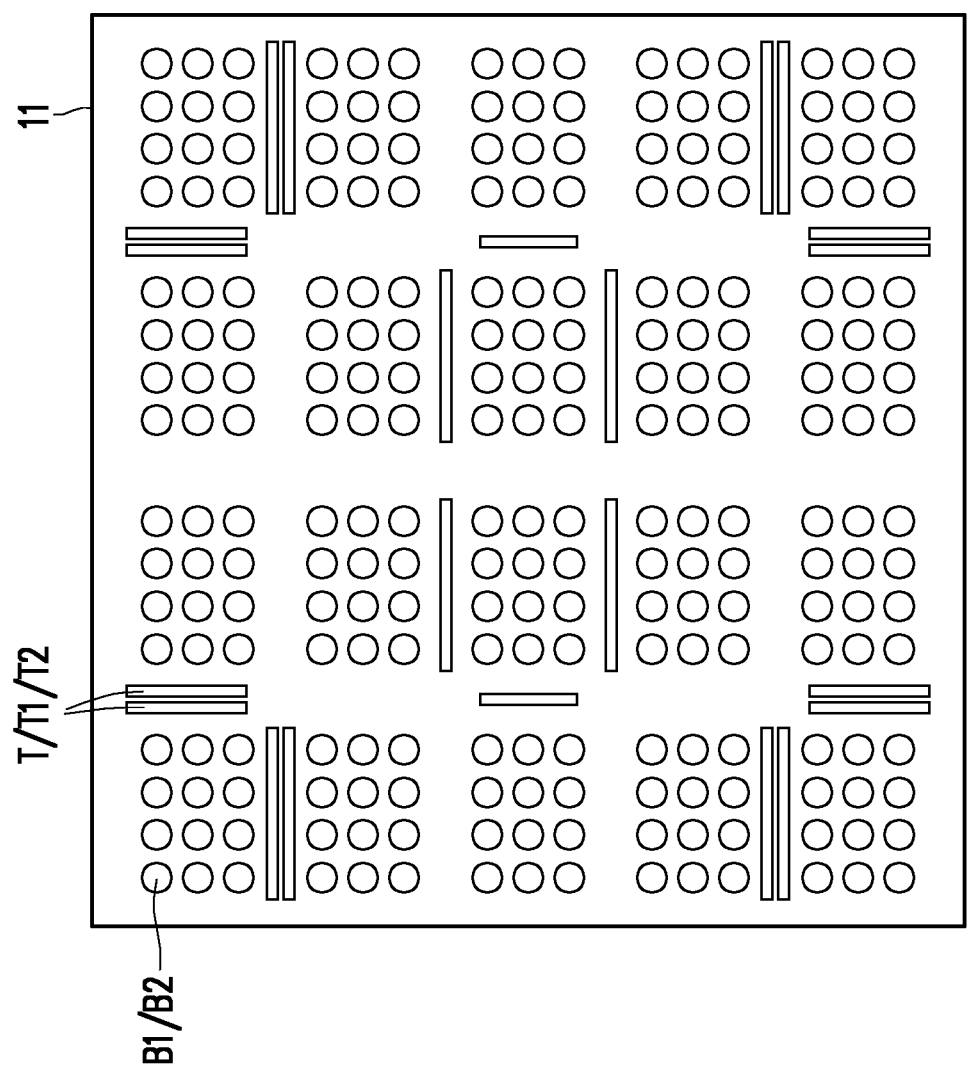
Figure 13:
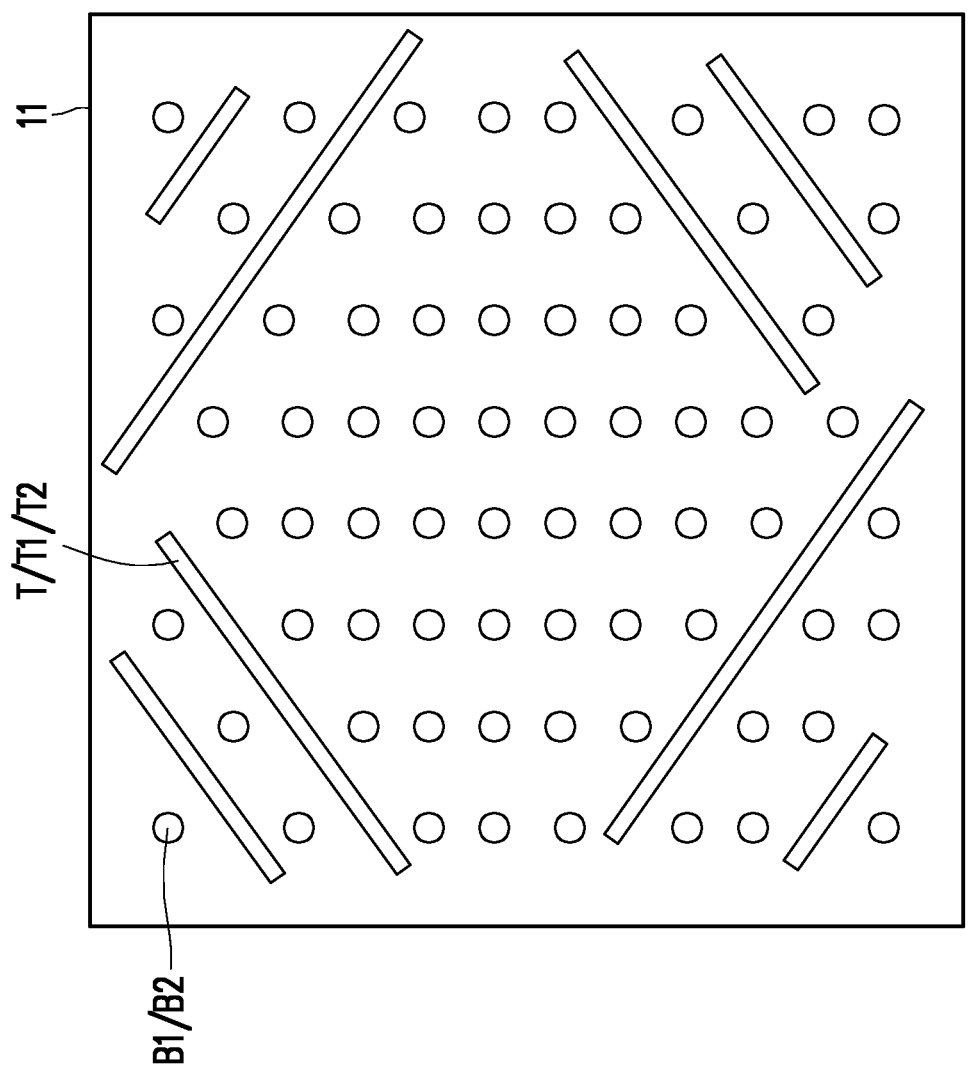

In some embodiments, at least some of the stress releasing trenches T are parallel to the edge of the circuit board structure. For example, all of the first trenches T1 and the second trenches T2 are parallel to the edge 11 of the circuit board structure, as shown in FIGS. 10-12. In some embodiments, at least some of the stress releasing trenches T are not parallel to the edge of the circuit board structure. For example, all of the first trenches T1 and the second trenches T2 are not parallel to the edge 11 of the circuit board structure, as shown in FIG. 13. In some embodiments, upon the design requirements, some of the stress releasing trenches T are parallel to the edge of the circuit board structure, while some of the stress releasing trenches T are not parallel to the edge of the circuit board structure.

In some embodiments, the stress releasing trenches T are arranged regularly or implemented based on a predetermined pattern rule, as shown in FIGS. 10-13. In some embodiments, the first trenches T1 and the second trenches T2 are arranged uniformly and regularly in the regions between two adjacent ball arrays of the circuit board structure, as shown in FIGS. 10-11. In some embodiments, the stress releasing trenches T are arranged more in a stress-dense region of the circuit board structure and arranged less in a stress-less region of the circuit board structure. For example, the first trenches T1 and the second trenches T2 are arranged more in a corner region of the circuit board structure and arranged less in a center region of the circuit board structure, as shown in FIG. 12. In some embodiments, the first trenches T1 and the second trenches T2 are arranged only in a stress-dense region (e.g., a corner region) of the circuit board structure, as shown in FIG. 13.

The above embodiments in which the stress releasing trenches have a bar-like shape are provided merely for illustration purposes, and are not to be construed as limiting the scope of the present disclosure. In alternative embodiments, the stress releasing trenches may have another shape such as an island shape, a grid shape, or the like. In yet alternative embodiments, the adjacent stress releasing trenches may form a ring shape (from a top view) or another suitable shape. In some embodiments, the stress releasing trenches are distributed regularly across the circuit board structure. In alternative embodiments, the stress releasing trenches are distributed randomly and unevenly across the circuit board structure. It is appreciated by people having ordinary skill in the art that other shapes and configurations of the stress releasing trenches are possible. In other words, the shapes, sizes, variations, configurations and distributions of the stress releasing trenches are not limited by the present disclosure.

Each of the circuit board structures of FIGS. 2-13 may be bonded to a suitable semiconductor package (e.g., package structure 20 in FIG. 1G) upon the design requirements.

In view of the above, in some embodiments of the disclosure, by forming stress releasing trenches in the circuit board structure, the CTE stress can be reduced and the package warpage can be prevented. Many variations of the above examples are contemplated by the present disclosure. It is understood that different embodiments may have different advantages, and that no particular advantage is necessarily required of all embodiments. The stress releasing trenches are contemplated as falling within the spirit and scope of the present disclosure as long as the CTE stress of the semiconductor device can be released properly and optimally.

In accordance with some embodiments of the present disclosure, a circuit board structure includes a core layer, a first build-up layer and a second build-up layer. The first build-up layer and the second build-up layer are disposed on opposite sides of the core layer. The circuit board structure has a plurality of stress releasing trenches extending into the first build-up layer and the second build-up layer.

In accordance with alternative embodiments of the present disclosure, a semiconductor device includes a circuit board structure, a plurality of semiconductor chips and an encapsulation layer. The semiconductor chips are bonded to the circuit board structure. The encapsulation layer is disposed between the semiconductor chips. The circuit board structure has a plurality of stress releasing trenches corresponding to the encapsulation layer between the semiconductor chips.

In accordance with yet alternative embodiments of the present disclosure, a method of forming a circuit board structure includes the following operations. A core layer is provided. A first build-up layer and a second build-up layer are formed on opposite sides of the core layer. A laser drilling process is performed to form a plurality of stress releasing trenches extending into the first build-up layer and the second build-up layer.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a circuit board structure having a core layer, and a first build-up layer and a second build-up layer disposed on opposite sides of the core layer;
a plurality of first trenches penetrating through the first build-up layer and the core layer, and extending into a portion of the second build-up layer; and
an array of semiconductor chips bonded to the first build-up layer of the circuit board structure,
wherein the circuit board structure has a center region and a corner region, and the first trenches are arranged more in the corner region of the circuit board structure while arranged less in the center region of the circuit board structure.

2. The semiconductor device of claim 1, wherein from a top view, the semiconductor chips are misaligned with the first trenches.

3. The semiconductor device of claim 1, further comprising a plurality of second trenches penetrating through the second build-up layer and the core layer, and extending into a portion of the first build-up layer.

4. The semiconductor device of claim 3, wherein from a top view, the semiconductor chips are misaligned with the second trenches.

5. The semiconductor device of claim 1, further comprising a soft material in the first trenches.

6. The semiconductor device of claim 5, further comprising an encapsulation layer disposed around the semiconductor structures and separated from the soft material in the first trenches.

7. The semiconductor device of claim 1, further comprising a redistribution layer structure between the circuit board structure and each of the semiconductor chips.

8. A semiconductor device, comprising:
a circuit board structure having conductive regions and dielectric regions alternately arranged side by side;
a plurality of stress releasing trenches disposed in the dielectric regions of the circuit board structure; and
a plurality of semiconductor chips bonded to the conductive regions of the circuit board structure;
wherein from a top view, the semiconductor chips are misaligned with the stress releasing trenches.

9. The semiconductor device of claim 8, further comprising an encapsulation layer around semiconductor chips and separated from the stress releasing trenches.

10. The semiconductor device of claim 8, wherein the stress releasing trenches are configured to extend from opposite top and bottom sides of the circuit board structure.

11. The semiconductor device of claim 8, wherein the circuit board structure is a device-free board structure.

12. The semiconductor device of claim 8, wherein the circuit board structure is a coreless circuit board structure.

13. A semiconductor device, comprising:
- a circuit board structure having a core layer, and a first build-up layer and a second build-up layer disposed on opposite sides of the core layer;
- a first mask layer and a second mask layer disposed on the first build-up layer and the second build-up layer, respectively;
- a plurality of first trenches penetrating through the first mask layer and the first build-up layer;
- a plurality of second trenches penetrating through the second mask layer and the second build-up layer; and
- an array of semiconductor chips bonded to the first build-up layer of the circuit board structure,
- wherein from a top view, the semiconductor chips are misaligned with the second trenches.

14. The semiconductor device of claim 13, further comprising a redistribution layer structure disposed between the first build-up layer and each of the semiconductor chips.

15. The semiconductor device of claim 14, wherein a location of the first and second trenches is overlapped with a location of some conductive patterns of the redistribution layer structure.

16. The semiconductor device of claim 13, wherein the first trenches and the second trenches further penetrate through the core layer.

17. The semiconductor device of claim 13, further comprising a plurality of plated vias penetrating through the core layer, wherein the plated vias are electrically connect to the first build-up layer and the second build-up layer.

18. The semiconductor device of claim 13, wherein the first trenches and the second trenches do not penetrate through the core layer.

19. The semiconductor device of claim 13, wherein from a top view, the semiconductor chips are misaligned with the first trenches.

20. The semiconductor device of claim 13, further comprising a soft material disposed in the first trenches and the second trenches, wherein a top surface of the soft material is flushed with a surface of the first mask layer or the second mask layer.

* * * * *